US012733157B2

(12) United States Patent
Shi et al.

(10) Patent No.: US 12,733,157 B2
(45) Date of Patent: Sep. 8, 2026

(54) SEMICONDUCTOR STRUCTURE COMPRISING TWO VERTICAL TRANSISTORS AND METHOD FOR FORMING SAME

(71) Applicant: CHANGXIN MEMORY TECHNOLOGIES, INC., Hefei City (CN)

(72) Inventors: Zhicheng Shi, Hefei (CN); Ruiqi Zhang, Hefei (CN); Xinran Liu, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 373 days.

(21) Appl. No.: 18/451,011

(22) Filed: Aug. 16, 2023

(65) Prior Publication Data

US 2024/0064971 A1 Feb. 22, 2024

Related U.S. Application Data

(63) Continuation of application No. PCT/CN2023/070465, filed on Jan. 4, 2023.

(30) Foreign Application Priority Data

Aug. 19, 2022 (CN) ......................... 202211003987.3

(51) Int. Cl.
*H10B 12/00* (2023.01)

(52) U.S. Cl.
CPC ......... *H10B 12/488* (2023.02); *H10B 12/033* (2023.02); *H10B 12/053* (2023.02);
(Continued)

(58) Field of Classification Search
CPC .............. H10B 12/033; H10B 12/0335; H10B 12/053; H10B 12/315; H10B 12/34;
(Continued)

(56) References Cited

U.S. PATENT DOCUMENTS

2022/0199628 A1* 6/2022 Sato ....................... H10B 12/05
2023/0276612 A1 8/2023 Harada

FOREIGN PATENT DOCUMENTS

CN 102522407 A 6/2012
CN 114373764 A 4/2022
(Continued)

OTHER PUBLICATIONS

European office action in application No. EP 23 85 3798, mailed on Jul. 16, 2025.

(Continued)

*Primary Examiner* — Hoai V Pham
(74) *Attorney, Agent, or Firm* — Syncoda LLC; Feng Ma

(57) ABSTRACT

The disclosure relates to a semiconductor structure and a method for forming the same. The semiconductor structure includes: a substrate; a storage array located on the substrate and including a plurality of memory cells arranged in an array along a first direction and a second direction, each memory cell including a transistor structure that includes a gate electrode and an active area that includes a first active area and a second active area distributed on opposite sides of the gate electrode along the first direction; a word line extending along the second direction, being continuously and electrically connected with a plurality of gate electrodes in the memory cells arranged at intervals along the second direction; a bit line extending along the first direction and located on outside of each of the memory cells along the second direction. The bit line is continuously and electrically connected with the first active area and the second active
(Continued)

area in a plurality of the memory cells arranged at intervals along the first direction.

14 Claims, 9 Drawing Sheets

(52) U.S. Cl.
CPC .......... *H10B 12/34* (2023.02); *H10B 12/482* (2023.02); *H10B 12/485* (2023.02)

(58) Field of Classification Search
CPC .. H10B 12/482; H10B 12/485; H10B 12/488; H10D 30/6728; H10D 64/512; H10D 84/00
See application file for complete search history.

(56) References Cited

FOREIGN PATENT DOCUMENTS

| | | | |
|---|---|---|---|
| CN | 114420644 | A | 4/2022 |
| CN | 114784006 | A | 7/2022 |
| CN | 115188807 | A | 10/2022 |
| WO | 2022097251 | A1 | 5/2022 |

OTHER PUBLICATIONS

International Search Report in the international application No. PCT/CN2023/070465, mailed on May 31, 2023, 3 pages.

* cited by examiner

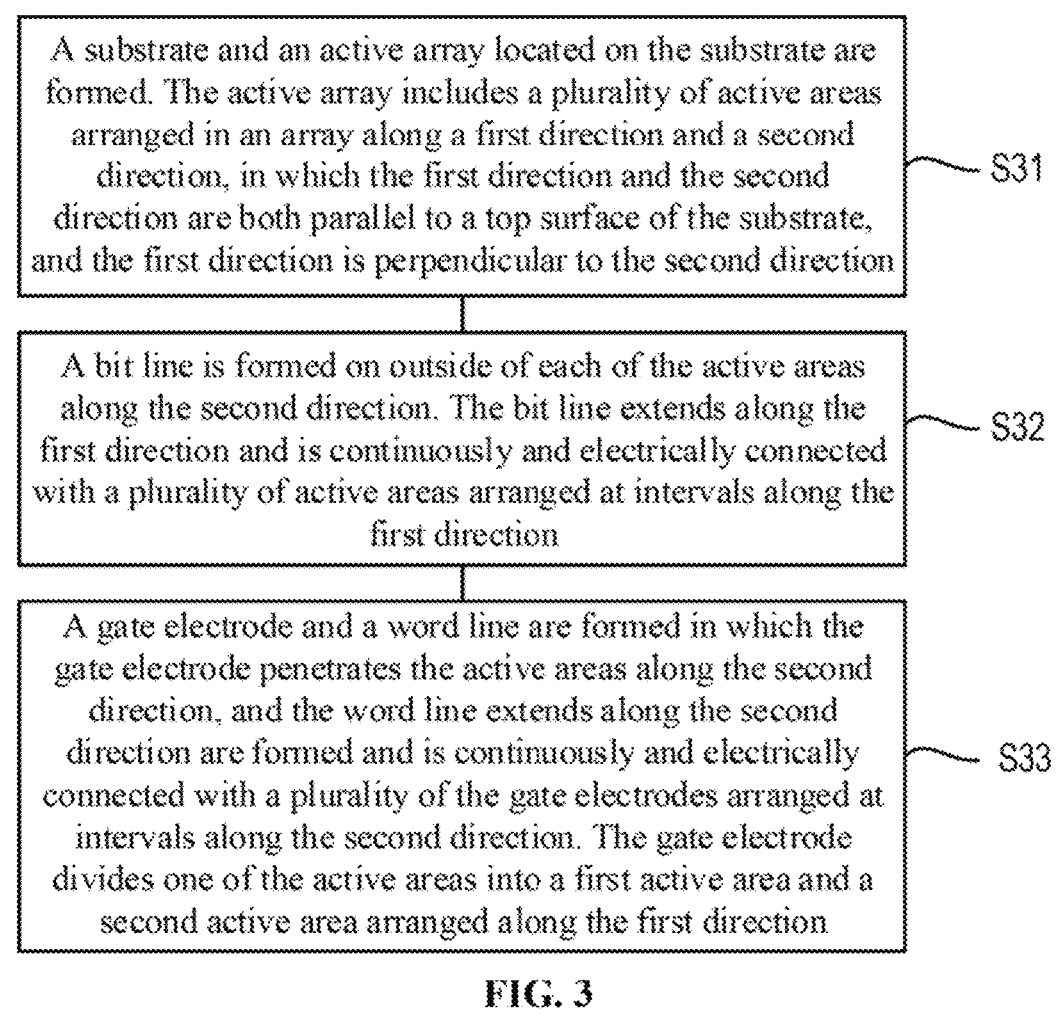

A substrate and an active array located on the substrate are formed. The active array includes a plurality of active areas arranged in an array along a first direction and a second direction, in which the first direction and the second direction are both parallel to a top surface of the substrate, and the first direction is perpendicular to the second direction — S31

A bit line is formed on outside of each of the active areas along the second direction. The bit line extends along the first direction and is continuously and electrically connected with a plurality of active areas arranged at intervals along the first direction — S32

A gate electrode and a word line are formed in which the gate electrode penetrates the active areas along the second direction, and the word line extends along the second direction are formed and is continuously and electrically connected with a plurality of the gate electrodes arranged at intervals along the second direction. The gate electrode divides one of the active areas into a first active area and a second active area arranged along the first direction — S33

FIG. 3

SEMICONDUCTOR STRUCTURE COMPRISING TWO VERTICAL TRANSISTORS AND METHOD FOR FORMING SAME

CROSS-REFERENCE TO RELATED APPLICATIONS

This application is a continuation of International Patent Application No. PCT/CN2023/070465, filed on Jan. 4, 2023, which claims priority to Chinese Patent Application No. 202211003987.3, filed on Aug. 19, 2022. Both of them are incorporated herein by reference in their entireties.

TECHNICAL FIELD

The disclosure relates to the technical field of manufacturing semiconductors, in particular to a semiconductor structure and a method for forming the same.

BACKGROUND

Dynamic random access memory (DRAM) is a semiconductor device commonly used in electronic devices such as computers, and is composed of multiple memory cells. Each of the memory cells usually includes a transistor and a capacitor. The gate of the transistor is electrically connected with a word line, the source is electrically connected with a bit line, and the drain is electrically connected with the capacitor. A word line voltage on the word line can control on and off of the transistor, so that data information stored in the capacitor can be read or written into the capacitor through the bit line.

A drain in a semiconductor structure such as DRAM is electrically connected with a capacitor sequentially through a node contact (NC) and a landing pad (LP). However, contact areas between the drain, the node contact and the landing pad are small, which will increase an internal resistance of the semiconductor structure and lead to a decrease of electrical performance of the semiconductor structure. In addition, a storage array in the semiconductor structure such as DRAM mostly adopts a 6F2 array structure, which has a low density and is not conducive to improving integration and storage capacity of the semiconductor structure.

Therefore, how to improve the density of the semiconductor structure and improve the electrical performance of the semiconductor structure is an urgent technical problem to be solved.

SUMMARY

A semiconductor structure and a method for forming the same are provided by embodiments of the disclosure to increase the density of the semiconductor structure and improve electrical performance of the semiconductor structure.

According to some embodiments, the disclosure provides a semiconductor structure, which includes a substrate, a storage array, a word line and a bit line.

The storage array is located on the substrate and includes a plurality of memory cells arranged in an array along a first direction and a second direction. Each of the memory cells includes a transistor structure. The transistor structure includes a gate electrode and an active area, and the active area includes a first active area and a second active area distributed on opposite sides of the gate electrode along the first direction. The first direction and the second direction are both parallel to a top surface of the substrate and the first direction is perpendicular to the second direction.

The word line extends along the second direction, is continuously and electrically connected with a plurality of the gate electrodes in a plurality of the memory cells arranged at intervals along the second direction.

The bit line extends along the first direction and is located on outside of the memory cell along the second direction. The bit line is continuously and electrically connected with the first active areas and the second active areas in a plurality of the memory cells arranged at intervals along the first direction.

According to other embodiments, the disclosure also provides a method for forming a semiconductor structure, including the following operations.

A substrate and an active array located on the substrate are formed. The active array includes a plurality of active areas arranged in an array along a first direction and a second direction. The first direction and the second direction are both parallel to a top surface of the substrate, and the first direction is perpendicular to the second direction.

A bit line is formed on outside of each of the active areas along the second direction. The bit line extends along the first direction and is continuously electrically connected with a plurality of the active areas arranged at intervals along the first direction.

A gate electrode penetrating the active areas along the second direction is formed. And a word line is formed, extends along the second direction and is continuously and electrically connected with a plurality of the gate electrodes arranged at intervals along the second direction. The gate electrode divides one of the active areas into a first active area and a second active area arranged along the first direction.

BRIEF DESCRIPTION OF THE DRAWINGS

FIG. 3 is a flowchart of a method for forming a semiconductor structure in an embodiment of the disclosure.

DETAILED DESCRIPTION

The semiconductor structure and method for forming the same provided by specific embodiments of the present disclosure will be described in detail below in combination with the accompany drawings.

Figure 1:
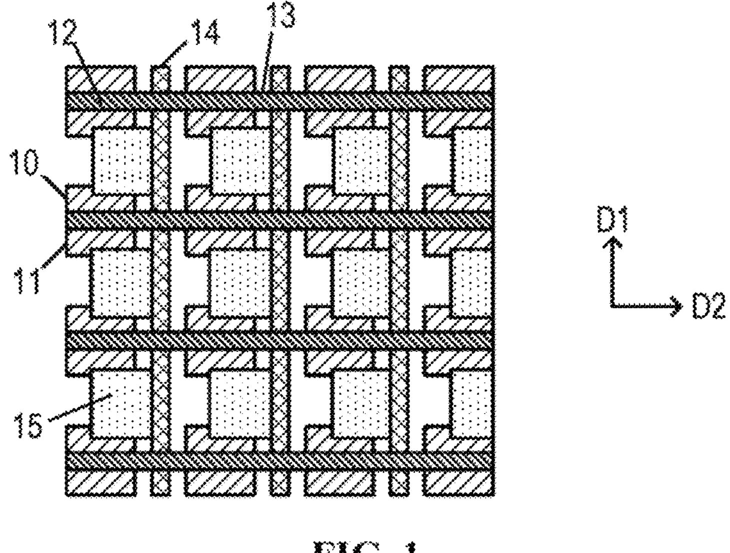
FIG. 1 is a top-view schematic diagram of a semiconductor structure in an embodiment of the disclosure.
Figure 2:
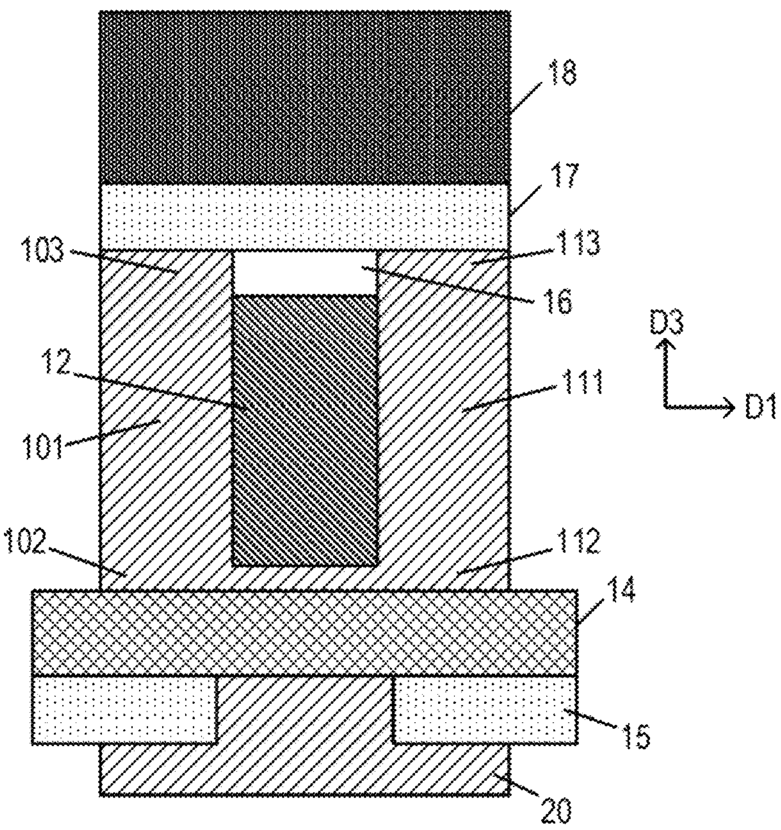
FIG. 2 is a schematic diagram of a memory cell in an embodiment of the disclosure.

A specific embodiment provides a semiconductor structure. FIG. 1 is a top-view schematic diagram of a semiconductor structure in an embodiment of the disclosure. FIG. 2 is a schematic diagram of a memory cell in an embodiment of the disclosure. As shown in FIGS. 1 and 2, the semiconductor structure includes a substrate 20, a storage array, a word line 13 and a bit line 14.

The storage array is located on the substrate 20 and includes a plurality of memory cells arranged in an array along a first direction D1 and a second direction D2. Each of the memory cells includes a transistor structure. The transistor structure includes a gate electrode 12 and an active area including a first active area 10 and a second active area 11. The first active area 10 and the second active area 11 are distributed on opposite sides of the gate electrode 12 along the first direction D1. The first direction D1 and the second direction D2 are both parallel to the top surface of the substrate 20 and the first direction D1 is perpendicular to the second direction D2.

The word line 13 extends along the second direction D2, and is continuously and electrically connected with a plurality of the gate electrodes 12 in the memory cells arranged at intervals along the second direction D2.

The bit line 14 extends along the first direction D1 and is located on outsides of the memory cells along the second direction D2. The bit line 14 is continuously and electrically connected with the first active areas 10 and the second active areas 11 in a plurality of the memory cells arranged at intervals along the first direction D1.

The semiconductor structure described in the embodiment may be but is not limited to DRAM. Hereinafter, the semiconductor structure is described by taking a DRAM as an example. The substrate 20 may be, but is not limited to, a silicon substrate. The embodiment will be described by taking the substrate 20 as a silicon substrate. In other embodiments, the substrate 20 may also be a semiconductor substrate, such as gallium nitride, gallium arsenide, gallium carbide, silicon carbide or Silicon-On-Insulator (SOI). The substrate 20 is used for supporting a device structure on the substrate. The plurality of memory cells are arranged in a two-dimensional array along the first direction D1 and the second direction D2 on the top surface of the substrate 20 to form the storage array. Each of the memory cells includes transistor structures. Each of the transistor structures includes a gate electrode and an active area. All the active areas in the storage array are also arrayed along the first direction D1 and the second direction D2 to form an active array. The gate electrode 12 in the transistor structure divides the active area into the first active area 10 and the second active area 11 distributed on opposite sides of the gate electrode 12 along the first direction D1, so that two transistors sharing the same one gate electrode and arranged along the first direction D1 can be formed in the transistor structure, and a bit line 14 located on outsides of the memory cell electrically connects the first active area 10 and the second active area 11 in the memory cell. The top surface of the substrate 20 in the embodiment refers to the surface of the substrate 20 facing the storage array. The phase "a/the plurality of" used in the embodiment refers to two or more.

In the embodiment, by arranging the structure of the memory cells, the position of the word lines 13 and the gate electrodes 12, the position of the bit line 14, and the connection relationship between the bit line 14 and the two transistors in the memory cells, the storage array in the embodiment can have a 4F2 array structure, and the density of the memory cells in the storage array is more than 2 times that of a 6F2 array structure, thereby greatly improving the density of the memory cells in the storage array, and thus improving the storage capacity of the semiconductor structure or reducing the size of the semiconductor structure.

When a selected memory cell is read and written, a bit line 14 and a word line 13 electrically connected with the selected memory cell are turned on (i.e., read and write signals are transmitted to the bit line 14 and the word line 13 electrically connected with the selected memory cell), so that two transistors in the selected memory cell are turned on simultaneously, thereby forming two parallel signal transmission channels in the selected memory cell. The two signal transmission channels transmit read and write signals simultaneously to realize read and write operation, thereby improving stability and transmission efficiency of the read and write signals in the memory cell and improving the electrical performance of the semiconductor structure.

In some embodiments, the first active area 10 includes a first channel region 101, and a first source region 102 and a first drain region 103 distributed on opposite sides of the first channel region 101 along a third direction D3. The third direction D3 is perpendicular to the top surface of the substrate 20.

The second active area 11 includes a second channel region 111, and a second source region 112 and a second drain region 113 distributed on opposite sides of the second channel region 111 along the third direction D3. The first channel region 101 and the second channel region 111 are symmetrically distributed with respect to the gate electrode 12.

Specifically, two of the transistors in each of the transistor structure are transistors in vertical structures. When one of the memory cells is given, two vertical signal transmission channels parallel with each other are simultaneously formed and turned on in this one memory cell. Furthermore, two of the transistors in the memory cell are symmetrically distributed along the first direction D1 with respect to an axis that passes through a center of the active area and extends along the second direction D2. That is, the first active area 10 and the second active area 11 are symmetrically distributed with respect to the axis (including the first channel region 101 and the second channel region 111, the first source 102 and the second source 112, and the first drain 103 and the second drain 113 are symmetrically distributed with respect to the axis, respectively), so that transmitted currents in the two transistors parallel with each other in the transistor structure are of a same magnitude, thereby further improving the performance of the semiconductor structure.

In some embodiments, each of the memory cells also includes a first gate dielectric layer between the first channel region 101 and the gate electrode 12, and a second gate dielectric layer between the second channel region 111 and the gate electrode 12. In an example, a material of the first gate dielectric layer and a material of the second gate dielectric layer are the same, for example, both are an oxide material (e.g. silicon dioxide).

In some embodiments, the semiconductor structure further includes a bit line contact array.

The bit line contact array is located below the storage array and includes a plurality of bit line contact structures 15 arranged in an array along the first direction D1 and the second direction D2.

The bit line contact structures 15 are electrically connected with the active area in the transistor structures. The plurality of the bit line contact structures 15 arranged at intervals along the first direction D1 are electrically connected with a same one bit line 14.

Specifically, the semiconductor structure also includes the plurality of bit line contact structures 15, which are located below the active areas and used for electrically connecting the bit lines 14 with the active areas in the memory cells. Signals are transmitted between the bit lines 14 and the memory cells through the bit line contact structures 15, so that the bit lines 14 can be arranged on the outsides of the memory cells along the second direction D2 to form the 4F2 array structure. Meanwhile, the connection lines between the bit lines 14 and the memory cells can be simplified, thus simplifying the manufacturing process of the semiconductor structure. In an example, the material of the bit line contact structures 15 is a conductive material such as polysilicon.

In order to improve the density in the semiconductor structure, the bit line contact array and the memory array are arranged in a staggered way, in some embodiments.

Each of the bit line contact structures 15 contacts and is electrically connected with two of the active areas adjacent along the first direction D1, and each of the active areas contacts and is electrically connected with two of the bit line contact structures 15 adjacent along the first direction D1.

In some embodiments, for each of the bit line contact structures 15 located between two adjacent ones of the memory cells along the first direction D1, one end of the bit line contact structure 15 along the first direction D1 is electrically connected with the first source region 102 in one of the memory cells, and the other end of the bit line contact structure 15 along the first direction D1 is electrically connected with the second source region 112 in another of the memory cells.

Every two of the bit line contact structures 15 contacting and electrically connected with the corresponding active area are symmetrically distributed with respect to an axis of the active area. The axis extends along the second direction D2.

Specifically, as shown in FIGS. 1 and 2, the plurality of bit line contact structures 15 are arranged in a two-dimensional array along the first direction D1 and the second direction D2 to form the bit line contact array. The staggered arrangement of the bit line contact array and the storage array means that projections of the bit line contact structures 15 in the bit line contact array on the top surface of the substrate 20 are staggered from projections of the memory cells in the storage array on the top surface of the substrate 20 along the first direction D1 and the second direction D2. For example, one bit line contact structure 15 is located between two of the active areas in the two memory cells adjacent along the first direction D1, and this one bit line contact structure 15 contacts and is in electrical connected with both the active areas in the two memory cells adjacent along the first direction D1.

A cross section of each bit line contact structure 15 may be in the shape of circular, elliptical or arbitrary polygonal. Taking the cross section of the bit line contact structure 15 in the rectangular as an example, the two opposite ends of the bit line contact structure 15 along the first direction D1 are in contact and electrical connection with two active areas adjacent along the first direction D1, respectively. The end of the bit line contact structure 15 along the second direction D2 is electrically connected with one bit line 14. The first active area 10 and the second active area 11 in one of the memory cells are in contact and electrical connection with two bit line contact structures 15 arranged at intervals along the first direction D1, respectively. Therefore, the density inside the semiconductor structure is further improved.

The two bit line contact structures 15 electrically connected to one active area contacts are symmetrically distributed with respect to an axis passing through a center of the active area and extending along the second direction D2. That is, the two bit line contact structures 15 connected with the first source region 102 and the second source region 112 in a same memory cell are symmetrically distributed with respect to the axis, so that the contact areas of the two bit line contact structures 15 with the first source region 102 and the second source region 112 in the same memory cell are equal, thereby further ensuring that current signals transmitted in the two transistors in the same memory cell are of the same magnitude to further improve the performance of the semiconductor structure.

In an embodiment, there are gaps between projections of the gate electrodes 12 on the top surface of the substrate 20 and projections of the bit line contact structures 15 on the top surface of the substrate 20. That is, the projections of the gate electrodes 12 on the top surface of the substrate 20 are not in contact with the projections of the bit line contact structures 15 on the top surface of the substrate 20, thereby reducing or even eliminating the parasitic capacitor effect between the gate electrodes 12 and the bit line contact structures 15.

In some embodiments, the projection of each of the bit line contact structures 15 on the top surface of the substrate 20 has the same shape and size as the shape and size of the projection of each of the active areas on the top surface of the substrate 20.

A distance between two adjacent ones of the bit line contact structures 15 is equal to a distance between two adjacent ones of the active areas. Therefore, a mask for forming the plurality of the active areas may be the same as a mask for forming the plurality of bit line contact structures 15, reducing the number of masks in the manufacturing process of the semiconductor structure and in turn reducing the manufacturing cost of the semiconductor structure.

In some embodiments, each of the memory cells further includes a capacitor structure 18.

The capacitor structure 18 is located above the transistor structure. The capacitor structure 18 is in electrical connection with the first drain region 103 and the second drain region 113. A projection of the capacitor structure 18 on the top surface of the substrate 20 at least completely covers a projection of the corresponding active area on the top surface of the substrate 20, so that contact areas between the capacitor structure 18 and two transistors in the transistor structure are increased, thereby reducing the contact resistance between the capacitor structure and the transistor structure. In an example, the projection of the active area on the top surface of the substrate 20 is within the projection of the capacitor structure 18 on the top surface of the substrate 20.

In some embodiments, the memory cell further includes a node contact structure 17.

The node contact structure 17 is located between the capacitor structure 18 and the transistor. One end of the node contact structure 17 is in contact and electrical connection with the first drain region 103 and the second drain region 113, and the other end is in contact and electrical connection with the capacitor structure 18.

The capacitor structure and the node contact structure are not shown in FIG. 1. Specifically, the memory cell includes one capacitor structure 18. That is, two transistors of the transistor structure are electrically connected with the same capacitor structure 18, thereby forming the memory cell with 2T1C structure. The memory cell also includes the node contact structure 17 located above the transistor structure along the third direction D3, a capacitor isolation layer 16 located between the node contact structure 17 and the gate electrode 12, and the capacitor structure 18 located on a side facing away from the transistor structure of the node contact structure 17. The capacitor isolation layer 16 is used for electrically isolating the gate electrode 12 from the node contact structure 17. In an embodiment, the material of the capacitor isolation layer 16 may be an insulating dielectric material such as an oxide material (e.g. silicon dioxide). The node contact structure 17 at least completely covers the first drain region 103 and the second drain region 113 in the transistor structure. The capacitor structures 18 is in contact and electrical connection with the corresponding node contact structures 17 without forming a landing pad (LP), thereby simplifying the manufacturing process of the semiconductor structure and reducing the manufacturing cost of the semiconductor structure. In an example, the material of the node contact structures 17 is a conductive material such as polysilicon.

In an example, in order to increase a contact area between the transistor structure and the corresponding capacitor structure 18 to reduce a contact resistance between the transistor structure and the capacitor structure 18, dimensions of the node contact structure 17 along the first direction D1 and the second direction D2 are both larger than dimensions of the whole composed of the first active area 10 and the second active area 11 along the first direction D1 and the second direction D2.

In some embodiments, the plurality of word lines 13 are arranged at intervals along the first direction D1 and the plurality of bit lines 14 are arranged at intervals along the second direction D2.

A distance between the two adjacent ones of the word lines 13 along the first direction D1, a distance between the two adjacent ones of the bit lines 14 along the second direction D2, and a distance between the two adjacent ones of the memory cells are equal to each other.

For example, the distance between the two adjacent ones of the word lines 13 along the first direction D1, the distance between the two adjacent ones of the bit lines 14 along the second direction D2, and the distance between the two adjacent ones of the memory cells, the distance between the two adjacent active areas and the distance between the two adjacent bit line contact structures 15 are equal to each other. Therefore, areas occupied by the memory cells are further reduced and the density of the memory cell in the storage array is further increased.

A specific embodiment further provides a method for forming a semiconductor structure. FIG. 3 is a flowchart of a method for forming a semiconductor structure in an embodiment of the disclosure. FIGS. 4-10 are main-process structural schematic diagrams in a process of forming a semiconductor structure according to a specific embodiment of the disclosure. Schematic diagrams of the semiconductor structure formed in the embodiment may be shown in FIGS. 1-2. As shown in FIGS. 3-10, the method for forming the semiconductor structure includes the following operations.

Figure 4:
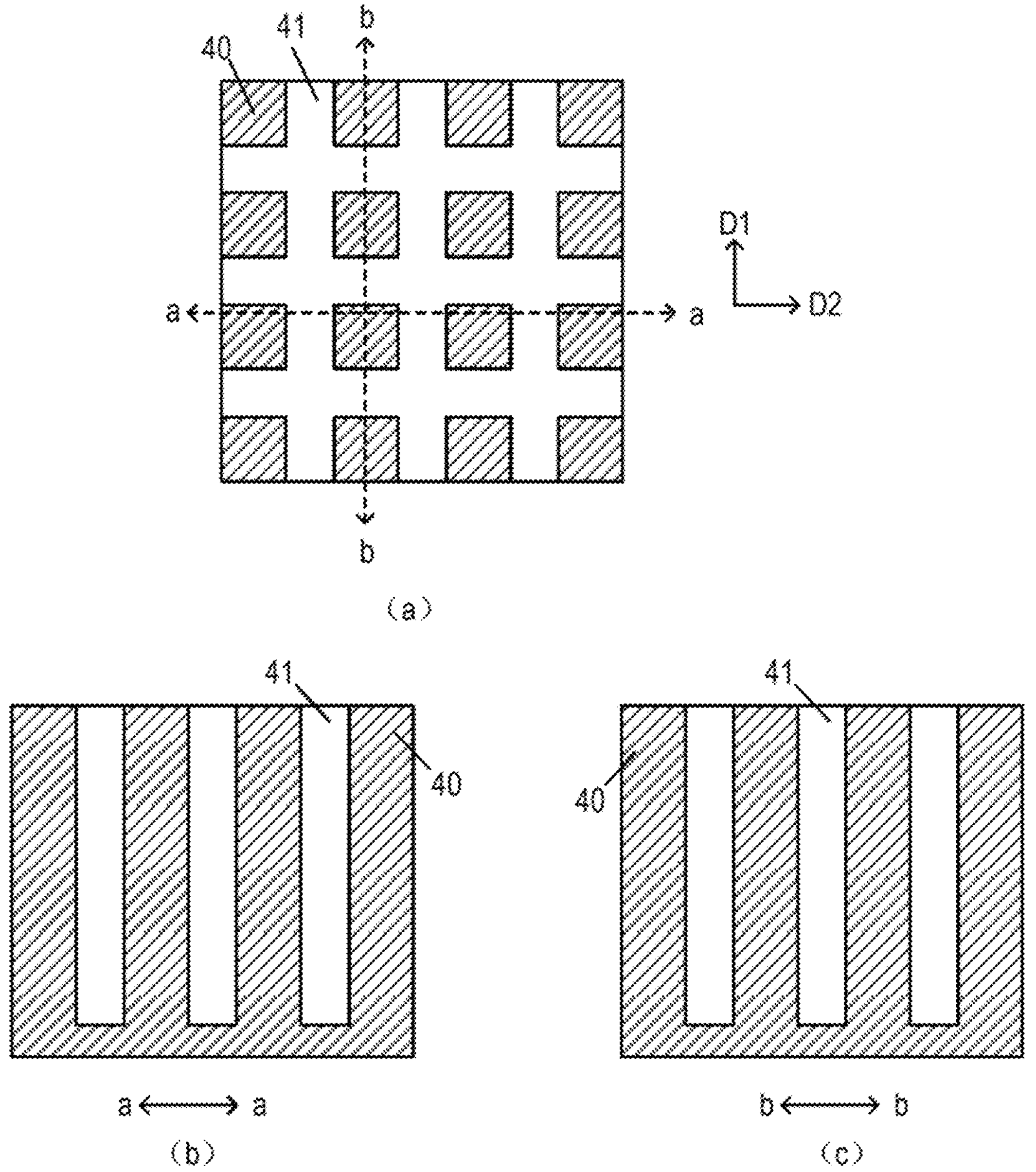
FIGS. 4-10 are main-process structural schematic diagrams in a process of forming a semiconductor structure according to a specific embodiment of the disclosure.

In S31, a substrate 20 and an active array located on the substrate 20 are formed. The active array includes a plurality of active areas 40 arranged in an array along a first direction D1 and a second direction D2, in which the first direction D1 and the second direction D2 are both parallel to a top surface of the substrate 20, and the first direction D1 is perpendicular to the second direction D2, as shown in FIG. 4, in which (a) of FIG. 4 is a top-view schematic diagram, (b) in FIG. 4 is a cross-sectional diagram of (a) in FIG. 4 along a-a, and (c) in FIG. 4 is a cross-sectional diagram of (a) in FIG. 4 along b-b.

Figure 7:
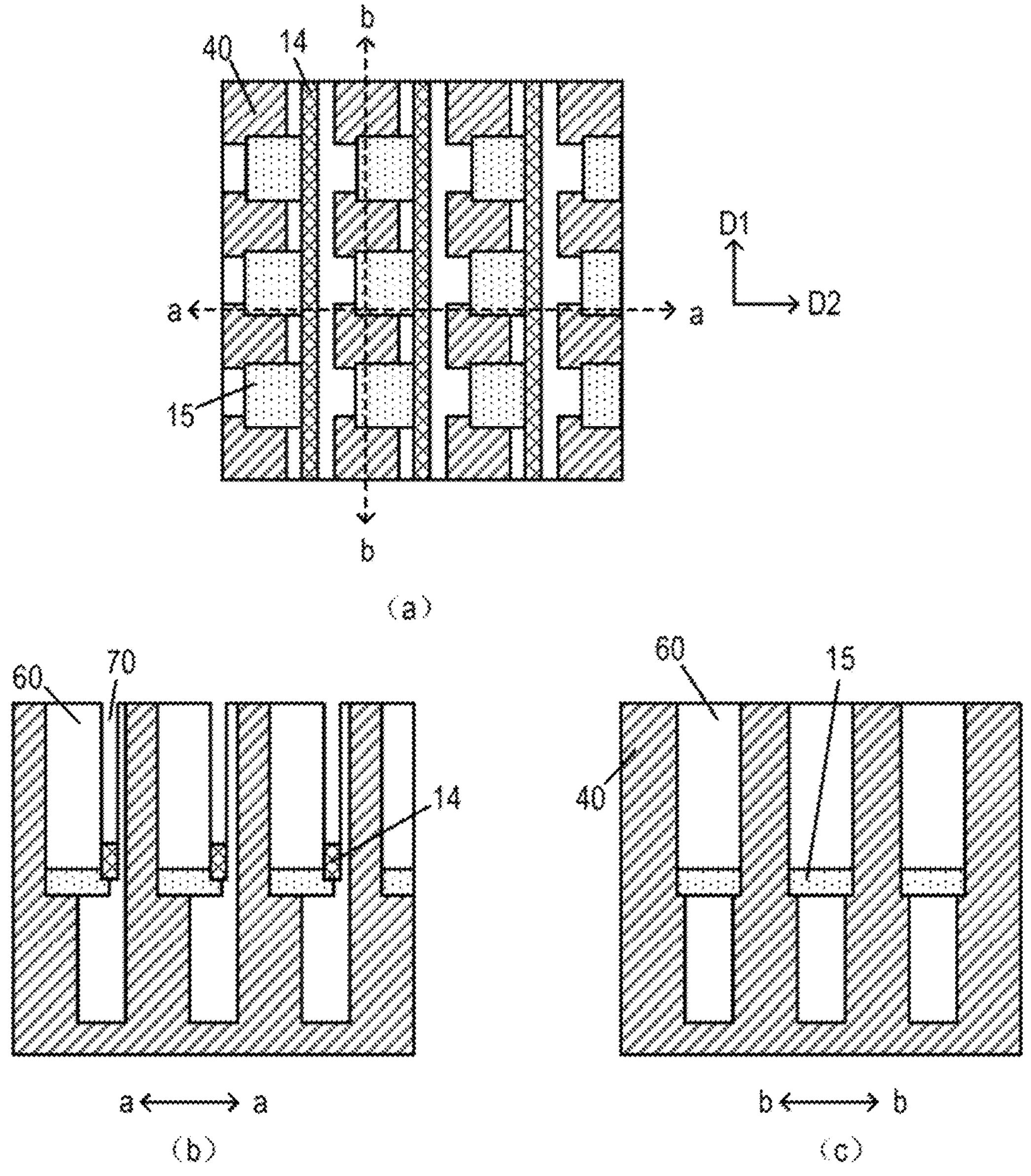

In S32, a bit line 14 is formed on outside of each of the active areas 40 along the second direction D2. The bit line 14 extends along the first direction D1, is continuously and electrically connected with a plurality of the active areas 40 arranged at intervals along the first direction D1, as shown in FIG. 7, in which (a) in FIG. 7 is a top-view schematic diagram, (b) in FIG. 7 is a cross-sectional diagram of (a) in FIG. 7 along a-a, and (c) in FIG. 7 is a cross-sectional diagram of (a) in FIG. 7 along b-b.

Figure 9:
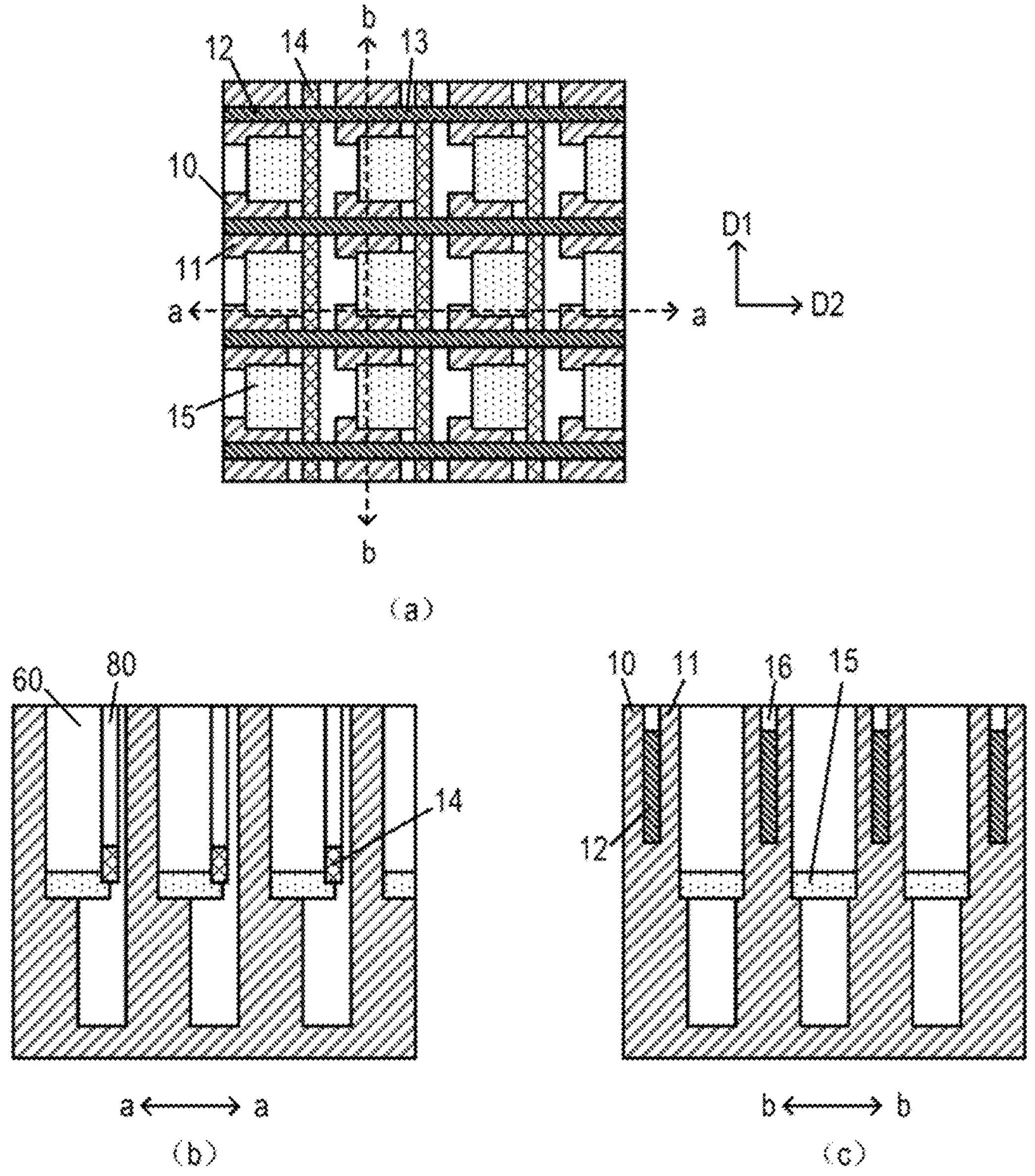
Figure 10:
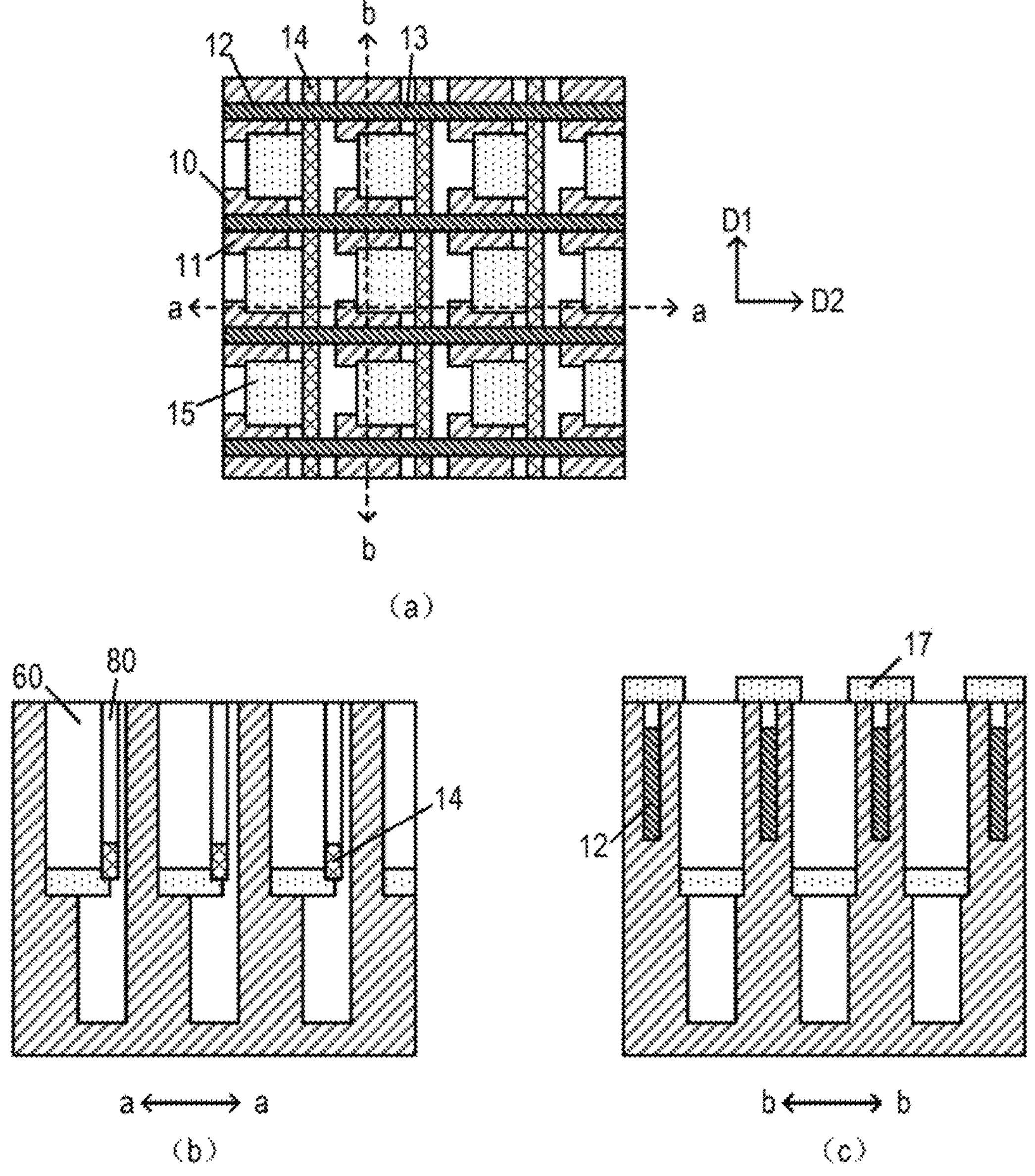

In S33, gate electrodes 12 penetrating the active areas 40 along the second direction D2 is formed, and a word line 13 is formed, extends along the second direction D2, is continuously and electrically connected with a plurality of the gate electrodes 12 arranged at intervals along the second direction D2. Each of the gate electrodes 12 divides one of the active areas 40 into a first active area 10 and a second active area 11 arranged along the first direction D1, as shown in FIG. 9, in which (a) in FIG. 9 is a top-view schematic diagram, (b) in FIG. 9 is a cross-sectional diagram of (a) in FIG. 9 along a-a, and (c) in FIG. 9 is a cross-sectional diagram of (a) in FIG. 9 along b-b.

In some embodiments, before the bit line 14 is formed on outside of the active area 40 along the second direction D2, the method further includes the following operation.

A bit line contact array below the active array is formed. The bit line contact array includes a plurality of bit line contact structures 15 arranged in an array along the first direction D1 and the second direction D2. Each of the bit line contact structures 15 is in in contact and electrical connection with the corresponding one of the active areas 40.

In some embodiments, the substrate 20 further includes a first isolation layer 41 located between two adjacent ones of the active areas 40. The forming a bit line contact array below the active array includes the following operations.

Part of the active areas 40 and part of the first isolation layers 41 are etched to form a plurality of first trenches 50 arranged in an array along the first direction D1 and the second direction D2. Each of the first trenches 50 is overlapped with two adjacent active areas 40 along the first direction D1, and each of the active areas 40 is overlapped with two adjacent first trenches 50 along the first direction D1.

Figure 5:
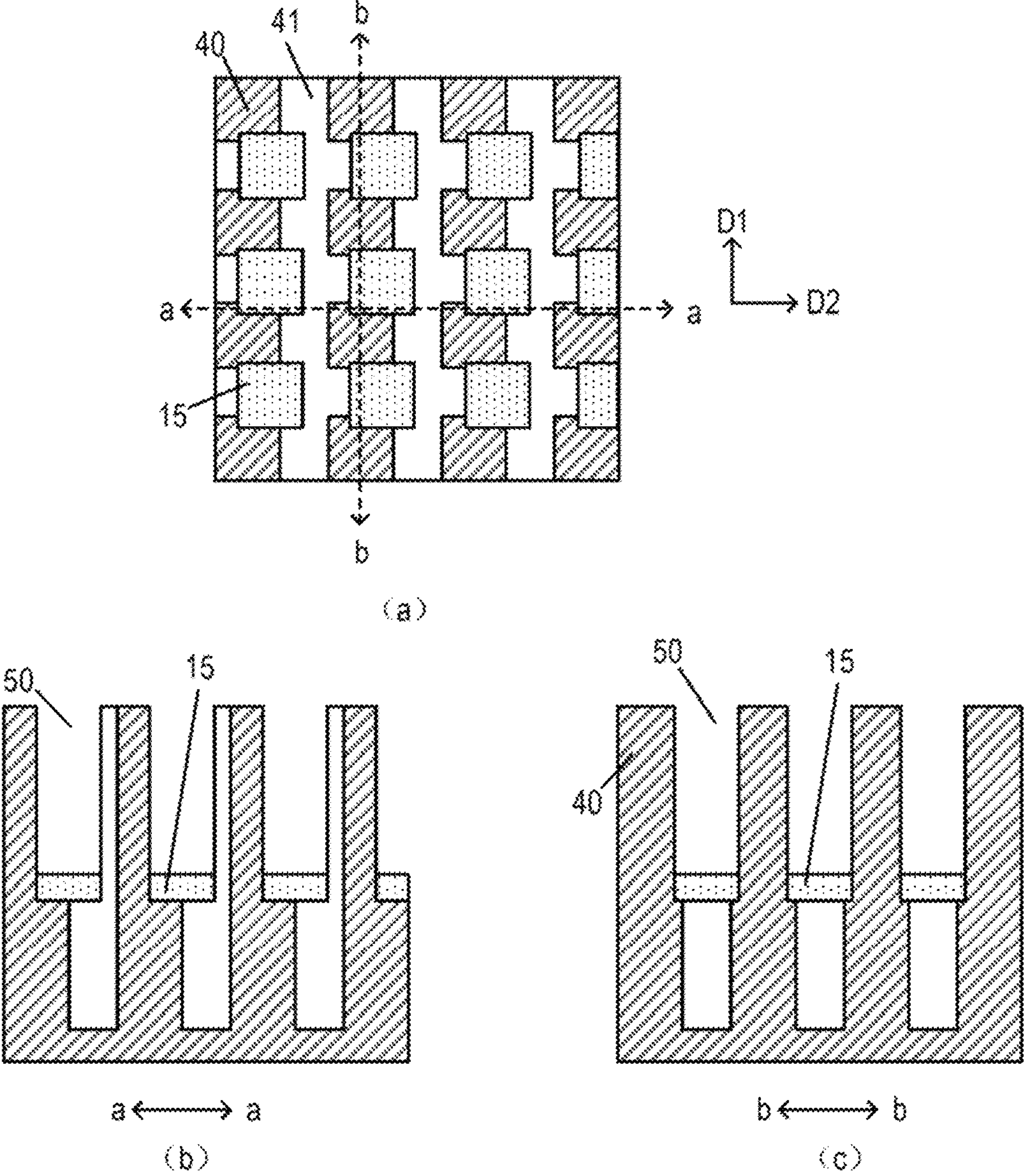

The bit line contact structures 15 in contact and electrical connection with the active areas 40 are formed at bottoms of the first trenches 50, as shown in FIG. 5 in which (a) in FIG. 5 is a top-view schematic diagram, (b) in FIG. 5 is a cross-sectional diagram of (a) in FIG. 5 along a-a, and (c) in FIG. 5 is a cross-sectional diagram of (a) in FIG. 5 along b-b.

Specifically, an initial substrate is provided first. The initial substrate is etched along the first direction D1 and the second direction D2 to form the plurality of active areas 40 arranged in a two-dimensional array along the first direction D1 and the second direction D2, and isolation trenches of the active areas located between adjacent active areas 40. Therefore, the active array is formed, and the initial substrate below the active array remains as the substrate 20. An insulating dielectric material such as an oxide (e.g. silicon dioxide) is filled in the isolation trenches of the active areas to form first isolation layers 41, as shown in FIG. 4. Part of the active areas 40 and part of the first isolation layers 41 are etched by a lithography process to form the plurality of first trenches 50 arranged in the array along the first direction D1 and the second direction D2. A conductive material such as polysilicon is filled in the first trenches 50, and a bit line contact structure 15 is formed at a bottom of each of the first trenches 50. The bit line contact structure 15 is electrically connected with the active areas 40, as shown in FIG. 5. During forming the first trenches 50 by etching, each of the first trenches 50 is overlapped with two adjacent active areas 40 along the first direction D1 and each of the active areas 40 is overlapped with two adjacent first trenches 50 along the first direction D1 by an alignment process, thereby further improving the density in the semiconductor structure.

In some embodiments, the forming bit line 14 on outside of each of the active areas 40 along the second direction D2 includes the following specific operations.

Figure 6:
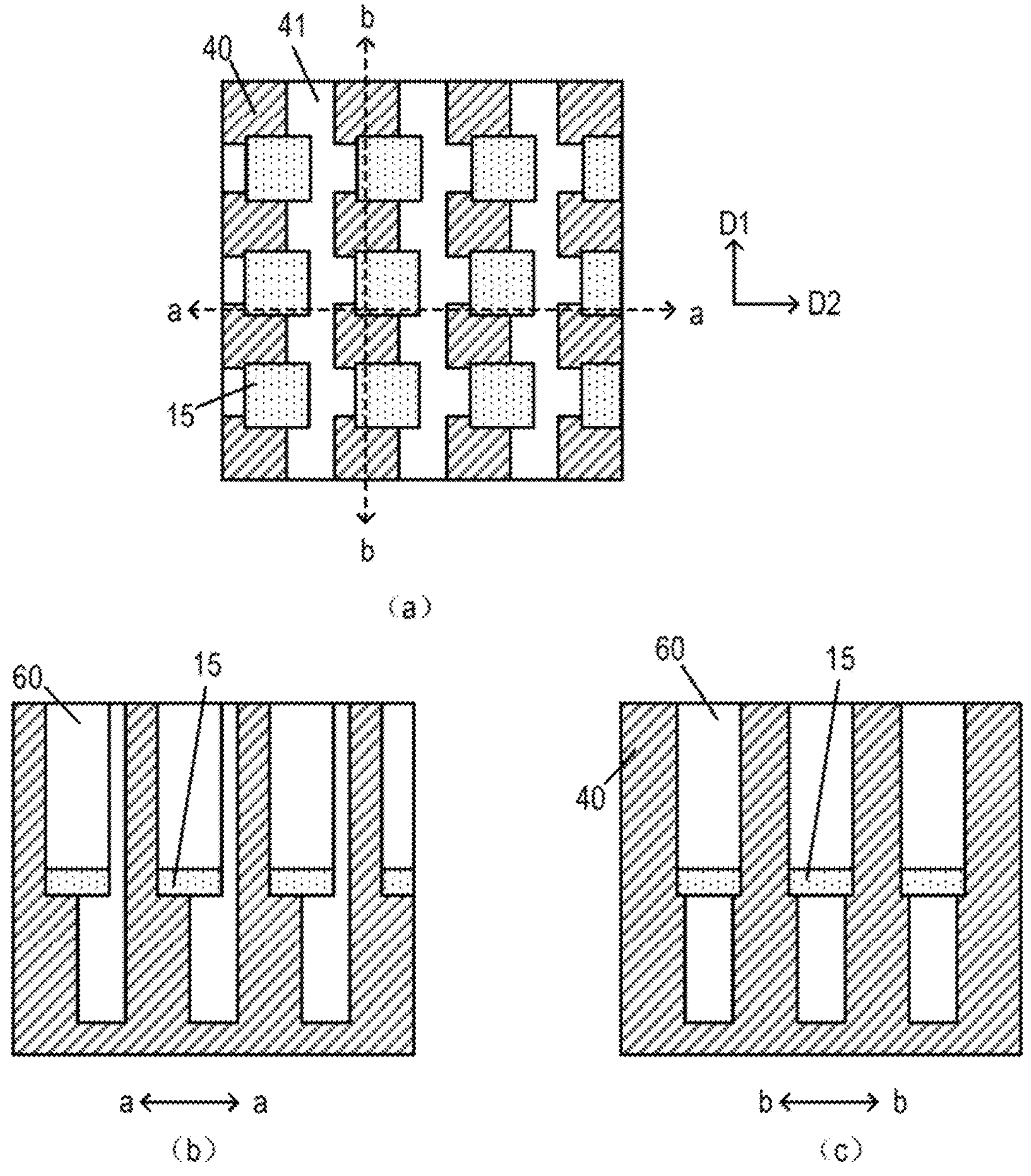

Second isolation layers 60 fully filling the first trenches 50 are formed, as shown in FIG. 6 in which (a) in FIG. 6 is a top-view schematic diagram, (b) in FIG. 6 is a cross-sectional diagram of (a) in FIG. 6 along a-a, and (c) in FIG. 6 is a cross-sectional diagram of (a) in FIG. 6 along b-b.

Part of the second isolation layers 60 and part of the first isolation layers 41 are etched to form second trenches 70 located on the outsides of the active areas 40 along the second direction D2 and exposing the bit line contact structures 15.

The bit lines 14 extending along the first direction D1 are formed in the second trenches 70. Each of the bit lines 14 is continuously in contact and electrical connection with a plurality of the bit line contact structures 15 arranged at intervals along the first direction D1, as shown in FIG. 7.

In some embodiments, the forming gate electrodes 12 penetrating the active areas 40 along the second direction D2, and word lines 13 that extends along the second direction D2 and continuously and electrically connected with a plurality of the gate electrodes 12 arranged at intervals along the second direction D2, includes the following specific operations.

Figure 8:
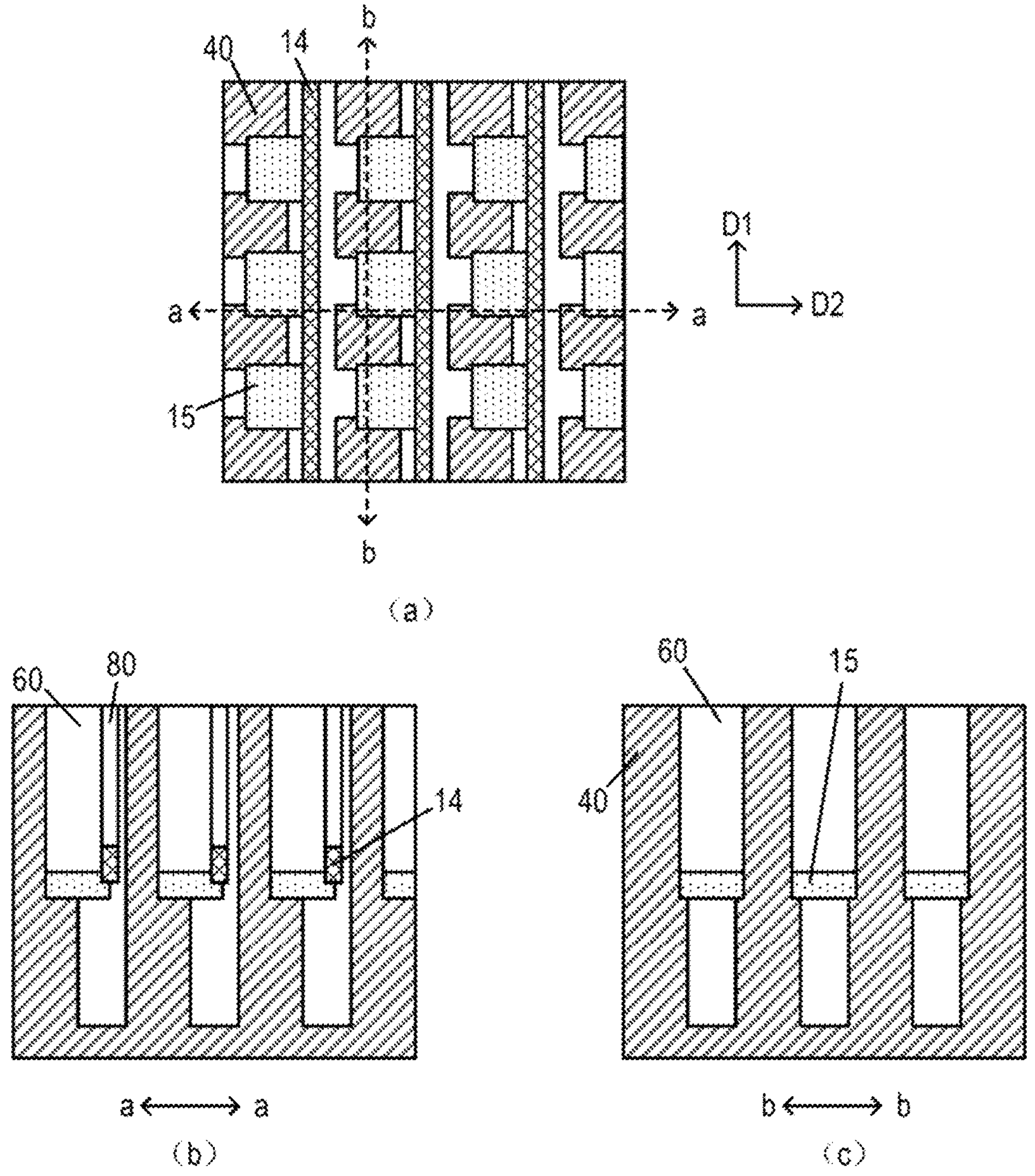

Third isolation layers 80 fully filling each of the second trenches 70 are formed, as shown in FIG. 8 in which (a) in FIG. 8 is a top-view schematic diagram, (b) in FIG. 8 is a cross-sectional diagram of (a) in FIG. 8 along a-a, and (c) in FIG. 8 is a cross-sectional diagram of (a) in FIG. 8 along b-b.

The active areas 40, the first isolation layers 41 and the third isolation layers 80 are etched to form gate trenches penetrating the active areas 40 along the second direction D2 in the active area 40, and to form word line trenches between two adjacent active areas 40 along the second direction D2.

The gate electrodes 12 are formed in the gate trenches and the word lines 13 are formed in the word line trenches, as shown in FIG. 9.

Specifically, each of the gate trenches divides one of the active areas into the first active area 10 and the second active area 11 arranged along the first direction D1. After forming the gate trenches and the word line trenches, the gate electrodes 12 fully filling the gate trenches and the word lines 13 fully filling the word line trenches are formed. Part of each gate electrode 12 and part of each word line 13 are etched back, so that the top surface of the gate electrode 12 lies below the top surface of the gate trench, and the top surface of the word line 13 lies below the top surface of the word line trench. Thereafter, an insulating dielectric material such as an oxide (e.g. silicon dioxide) is filled in the gate trenches and the word line trenches to form capacitor isolation layers 16 covering the gate electrodes 12 and the word lines 13, as shown in FIG. 9. In an example, materials of the gate electrode 12 and the word line 13 are both a conductive material such as tungsten or TiN.

In some embodiments, after forming gate electrodes 12 that penetrates the active areas along the second direction D2 and forming the word line 13 that extends along the second direction D2, and is continuously and electrically connected with a plurality of the gate electrodes 12 arranged at intervals along the second direction D2, the method further includes the following operations.

A capacitor structure 18 located the active area 40 is formed. The capacitor structure 18 is electrically connected with the first drain region 10 and the second drain region 11. A projection of the capacitor structure 18 on the top surface of the substrate 20 at least completely covers a projection of the active area 40 on the top surface of the substrate 20.

Specifically, a node contact structure 17 covering the first active area 10, the second active area 11 and the capacitor isolation layer 16 is formed above the active area, and then the capacitor structure 18 is formed above the node contact structure 17. In an example, the capacitor structure includes a lower electrode layer covering a surface of the node contact structure 17 and electrically connected with the node contact structure 17, a dielectric layer covering a surface of the lower electrode layer, and an upper electrode layer covering a surface of the dielectric layer.

In the semiconductor structure and the method for forming the same provided by the embodiments of the disclosure, each memory cell includes transistors. The gate electrode in the transistor structure divides the active area into the first active area and the second active area, so that two transistors sharing the one gate electrode may be formed in the transistor structure, and a same bit line is electrically connected with the first active area and the second active area in the memory cell. Therefore, after the word line and the bit line electrically connected with the memory cell are turned on, two signal transmission channels in parallel can be formed in the memory cell, which can not only improve the signal transmission efficiency and improve the electrical performance of the semiconductor structure, but also form a storage array structure of 4F2 (where F is a feature dimension), realizing an improvement of the integration density of the memory cells in the semiconductor structure. In some other embodiments of the disclosure, the projection of the capacitor structure on the top surface of the substrate at least completely covers the projection of the corresponding active area on the top surface of the substrate, thereby increasing a contact area between the capacitor structure and the transistor structure, reducing a contact resistance inside the memory cell, and improving the electrical performance of the semiconductor structure. Furthermore, in some embodiments of the disclosure, the capacitor structure is in direct contact and electrical connection with the corresponding one the node contact structures without forming a landing pad (LP), thereby simplifying the manufacturing process of the semiconductor structure and reducing the manufacturing cost of the semiconductor structure.

The above are only the preferred embodiments of the disclosure, and it should be noted that for those skilled in the art, without departing from the principles of the disclosure, several modifications and improvements may be made, which also fall within the scope of protection of the disclosures.

What is claimed is:

1. A semiconductor structure comprising:

a substrate;

an storage array located on the substrate and comprising a plurality of memory cells arranged in an array along a first direction and a second direction, each of the memory cells comprising a transistor structure, the transistor structure comprising a gate electrode and an active area, and the active area comprising a first active area and a second active area distributed on opposite sides of the gate electrode along the first direction, wherein the first direction and the second direction are both parallel to a top surface of the substrate and the first direction is perpendicular to the second direction;

a word line extending along the second direction, being continuously and electrically connected with a plurality of gate electrodes in the memory cells arranged at intervals along the second direction; and a bit line extending along the first direction, located on outside of each of the memory cells along the second direction, being continuous and electrically connected with the first active areas and the second active areas in a plurality of the memory cells arranged at intervals along the first direction;

wherein the first active area comprises a first channel region, and a first source region and a first drain region distributed on opposite sides of the first channel region along a third direction, and the third direction is perpendicular to the top surface of the substrate; and the second active area comprises a second channel region, and a second source region and a second drain region distributed on opposite sides of the second channel region along the third direction, and the first channel region and the second channel region are symmetrically distributed with respect to the gate electrode;

the first source region and the second source region are connected along the first direction at the bottom of the gate electrode.

2. The semiconductor structure of claim 1, wherein the semiconductor structure further comprises:

a bit line contact array located below the storage array, comprising a plurality of bit line contact structures arranged in an array along the first direction and the second direction;

wherein the bit line contact structures are electrically connected with the active area in the transistor structure, and a plurality of the bit line contact structures arranged at intervals along the first direction are electrically connected with a same one bit line.

3. The semiconductor structure of claim 2, wherein the bit line contact array and the memory array are arranged in a staggered way; and each of the bit line contact structures is in contact and electrical connection with two active areas adjacent along the first direction, and each of the active areas is in contact and electrical connection with two bit line contact structures adjacent along the first direction.

4. The semiconductor structure of claim 3, wherein for one bit line contact structure located between two adjacent ones of the memory cells along the first direction, one end of the one bit line contact structure along the first direction is electrically connected with the first source region in one of the two adjacent memory cells, and another end of the one bit line contact structure along the first direction is electrically connected with the second source region in another of the two adjacent memory cells; and the two bit line contact structures in contact and electrical connection with the active area are symmetrically distributed with respect to an axis of the active area, and the axis extends along the second direction.

5. The semiconductor structure of claim 3, wherein a projection of the bit line contact structure on the top surface of the substrate has a same shape and a same size as a shape and size of a projection of the active area on the top surface of the substrate; and a distance between two adjacent bit line contact structures is equal to a distance between two adjacent active areas.

6. The semiconductor structure of claim 1, wherein each of the memory cells further comprises:

a capacitor structure located above the transistor structure, being electrically connected with the first drain region and the second drain region, wherein a projection of the capacitor structure on the top surface of the substrate at least completely covers a projection of the active area on the top surface of the substrate.

7. The semiconductor structure of claim 6, wherein the each of the memory cells further comprises:

a node contact structure located between the capacitor structure and a transistor, wherein one end of the node contact structure is in contact and electrical connection with the first drain region and the second drain region, and another end of the node contact structure is in contact and electrical connection with the capacitor structure.

8. The semiconductor structure of claim 1, wherein a plurality of word lines are arranged at intervals along the first direction and a plurality of bit lines are arranged at intervals along the second direction; and a distance between two adjacent word line along the first direction, a distance between two adjacent bit lines along the second direction, and a distance between two adjacent ones of the memory cells are all equal to each other.

9. A method for forming a semiconductor structure, comprising:

forming a substrate and an active array located on the substrate, the active array comprising a plurality of active areas arranged in an array along a first direction and a second direction, the first direction and the second direction being both parallel to a top surface of the substrate, and the first direction being perpendicular to the second direction;

forming a bit lines on outside of each of the active areas along the second direction, the bit line extending along the first direction, being continuously and electrically connected with a plurality of the active areas arranged at intervals along the first direction;

forming a gate electrode penetrating a plurality of the active areas along the second direction and forming a word line that extends along the second direction, is continuously and electrically connected with a plurality of gate electrode arranged at intervals along the second direction, the gate electrode dividing one of the active areas into a first active area and a second active area arranged along the first direction;

wherein the first active area comprises a first channel region, and a first source region and a first drain region distributed on opposite sides of the first channel region along a third direction, and the third direction is perpendicular to the top surface of the substrate; and the second active area comprises a second channel region, and a second source region and a second drain region distributed on opposite sides of the second channel region along the third direction, and the first channel region and the second channel region are symmetrically distributed with respect to the gate electrode;

the first source region and the second source region are connected along the first direction at the bottom of the gate electrode.

10. The method for forming a semiconductor structure of claim 9, further comprising:

forming a bit line contact array below the active array, the bit line contact array comprising a plurality of bit line contact structures arranged in an array along the first direction and the second direction, each of the bit line contact structures being in contact and electrical connection with a corresponding one of the active areas, before the forming a bit line on outside of each of the active areas along the second direction.

11. The method for forming a semiconductor structure of claim 10, wherein the substrate further comprises a first isolation layer located between two adjacent ones of the active areas, and the forming a bit line contact array below the active array comprises:

etching part of the active area and part of the first isolation layer to form a plurality of first trenches arranged in an array along the first direction and the second direction, wherein each of the first trenches is overlapped with two adjacent active areas along the first direction, and each of the active areas is overlapped with two adjacent first trenches along the first direction; and forming a bit line contact structure at a bottom of each of the first trenches, wherein the bit line contact structure is electrically connected with the active area.

12. The method for forming a semiconductor structure of claim 11, wherein the forming a bit line on outside of each of the active areas along the second direction comprises:

forming a second isolation layer fully filling each of the first trenches;

etching part of the second isolation layer and part of the first isolation layer to form a second trench located on the outside of the active area along the second direction and exposing the bit line contact structure; and forming the bit line extending along the first direction in the second trench, wherein the bit line is continuously in contact and electrical connection with a plurality of the bit line contact structures arranged at intervals along the first direction.

13. The method for forming a semiconductor structure of claim 12, wherein the forming a gate electrode penetrating a plurality of the active areas along the second direction and forming a word line that extends along the second direction and is continuously and electrically connected with a plurality of gate electrode arranged at intervals along the second direction, comprises:

forming a third isolation layer fully filling the second trench;

etching the active area, the first isolation layer and the third isolation layer to form a gate trench that penetrates the active area along the second direction in the active area, and form a word line trench between two adjacent ones of the active areas along the second direction; and forming the gate electrode in the gate trench and forming the word line in the word line trench.

14. The method for forming a semiconductor structure of claim 9, further comprising:

forming a capacitor structure located above the active area, the capacitor structure being electrically connected with the first drain region and the second drain region, and a projection of the capacitor structure on the top surface of the substrate at least completely covering a projection of the active area on the top surface of the substrate, after forming a gate electrode penetrating a plurality of the active areas along the second direction and forming a word line that extends along the second direction and is continuously and electrically connected with a plurality of gate electrode arranged at intervals along the second direction.

* * * * *